(12) United States Patent
Wang et al.

(10) Patent No.: US 11,373,836 B2
(45) Date of Patent: Jun. 28, 2022

(54) METHOD OF MANUFACTURING ELECTRON SOURCE

(71) Applicant: 38th Research Institute, China Electronics Technology Group Corporation, Anhui (CN)

(72) Inventors: Xuehui Wang, Anhui (CN); Junting Wang, Anhui (CN); Xianbin Hu, Anhui (CN); Dizhi Chen, Anhui (CN); Guang Tang, Anhui (CN); Huarong Liu, Anhui (CN); Lei Zheng, Anhui (CN); Qing Qian, Anhui (CN); Chunning Zheng, Anhui (CN); Guochao Wang, Anhui (CN)

(73) Assignee: 38th Research Institute, China Electronics Technology Group Corporation, Anhui (CN)

( * ) Notice: Subject to any disclaimer, the term of this patent is extended or adjusted under 35 U.S.C. 154(b) by 116 days.

(21) Appl. No.: 16/966,908

(22) PCT Filed: Dec. 27, 2018

(86) PCT No.: PCT/CN2018/124330
§ 371 (c)(1),
(2) Date: Aug. 3, 2020

(87) PCT Pub. No.: WO2020/073511
PCT Pub. Date: Apr. 16, 2020

(65) Prior Publication Data
US 2021/0050176 A1  Feb. 18, 2021

(30) Foreign Application Priority Data
Oct. 12, 2018 (CN) .......................... 201811190769.9

(51) Int. Cl.
*H01J 37/073* (2006.01)
*H01J 37/065* (2006.01)
*H01J 3/02* (2006.01)

(52) U.S. Cl.
CPC ............ *H01J 37/073* (2013.01); *H01J 3/021* (2013.01); *H01J 37/065* (2013.01)

(58) Field of Classification Search
CPC ......... H01J 37/065; H01J 37/073; H01J 3/021
See application file for complete search history.

(56) References Cited

U.S. PATENT DOCUMENTS 3,343,256 A * 9/1967 Smith ................. H01L 21/2633
438/565
5,705,887 A   1/1998 Shaffer
(Continued)

FOREIGN PATENT DOCUMENTS

| CN | 1242592 A | 1/2000 |
| CN | 101425438 A | 5/2009 |

(Continued)

OTHER PUBLICATIONS

International Search Report (English translation) and Written Opinion, International Application No. PCT/CN2018/124330, dated Jul. 10, 2019, 10 pp.

(Continued)

*Primary Examiner* — David E Smith
(74) *Attorney, Agent, or Firm* — Myers Bigel, P.A.

(57) ABSTRACT

The present disclosure provides a method of manufacturing an electron source. The method includes forming one or more fixed emission sites on at least one needle tip, the fixed emission sites including a reaction product formed by metal atoms on a surface of the needle tip and gas molecules.

17 Claims, 6 Drawing Sheets

(56) References Cited

U.S. PATENT DOCUMENTS

| | | | |
|---|---|---|---|
| 5,763,880 A | 6/1998 | Nisiyama et al. | |
| 6,281,626 B1* | 8/2001 | Nakamura | H01J 9/022 |
| | | | 313/631 |
| 6,573,642 B1* | 6/2003 | VonAllmen | H01J 1/3044 |
| | | | 313/496 |
| 11,189,453 B2* | 11/2021 | Liu | H01J 1/3048 |
| 2004/0189176 A1* | 9/2004 | Koga | H01J 1/3044 |
| | | | 313/311 |
| 2009/0117674 A1 | 5/2009 | Wei et al. | |
| 2010/0006447 A1* | 1/2010 | Winkler | C25D 5/48 |
| | | | 205/205 |
| 2012/0181925 A1 | 7/2012 | Arimoto et al. | |
| 2013/0200788 A1 | 8/2013 | Cho et al. | |
| 2014/0077684 A1 | 3/2014 | Liu et al. | |
| 2015/0002009 A1 | 1/2015 | Zhang et al. | |
| 2015/0054398 A1* | 2/2015 | Yan | H01J 1/304 |
| | | | 427/126.3 |
| 2018/0005791 A1* | 1/2018 | Schultz | H01J 9/025 |

FOREIGN PATENT DOCUMENTS

| | | | | |
|---|---|---|---|---|
| CN | 102629538 A | 8/2012 | | |
| CN | 102789946 A | 11/2012 | | |
| CN | 102789947 A | 11/2012 | | |
| CN | 102842474 A | 12/2012 | | |
| CN | 102915903 A | 2/2013 | | |
| EP | 2546862 A1 | 1/2013 | | |
| JP | S5912533 A | 1/1984 | | |
| JP | 2003100244 A | 4/2003 | | |
| JP | 2007265685 A | * 10/2007 | | H01J 1/304 |
| JP | 2011171088 A | 9/2011 | | |
| JP | 5551830 B2 | 5/2014 | | |
| TW | 416083 A | 12/2000 | | |
| TW | 201216322 A | 4/2012 | | |
| WO | 2004/012932 A1 | 2/2004 | | |
| WO | 2012/174993 A1 | 12/2012 | | |
| WO | WO-2015004981 A | * 1/2015 | | H01J 37/073 |

OTHER PUBLICATIONS

First Office Action, TW Application No. 108136468, dated Jun. 16, 2020, 10 pp.

"Notice of Reasons for Refusal and English language translation", JP Application No. 2020-542132, dated Jun. 28, 2021, 6 pp.

"Communication with Supplementary European Search Report", EP Application No. 18936558.8, dated Mar. 25, 2021, 10 pp.

"First Office Action and English language translation", CN Application No. 201811190769.9, dated Aug. 17, 2020, 24 pp.

Lai, Chen , et al., "Emission and evaporation properties of 75 at.% Re-25 at.% W mixed matrix impregnated cathode", Applied Surface Science, vol. 427, Part A, Jan. 1, 2018, 874-882.

Shi, Qingxuan , "Research on Field Emission Array Film Technology", (Masters thesis, University of Electronic Science and Technology of China), Apr. 1, 2007, 70 pp. (Retrieved from China HoWnet).

* cited by examiner

METHOD OF MANUFACTURING ELECTRON SOURCE

RELATED APPLICATIONS

The present application is a 35 U.S.C. 371 national stage application of PCT International Application No. PCT/CN2018/124330, filed on Dec. 27, 2018, which claims the benefit of Chinese Patent Application No. 201811190769.9, filed on Oct. 12, 2018, the entire disclosures of both of which are incorporated herein by reference.

TECHNICAL FIELD

The present disclosure relates to the field of electron source technology, and in particular, to a method of manufacturing a field emission electron source.

BACKGROUND

Free electrons in metal may be emitted under certain conditions. If a cathode is made of metal and made into a very fine tip and it is applied by a voltage of thousands of volts in a vacuum, then the electrons in the metal may be emitted from the cathode cold metal. This method of emitting electrons is called as field emission, belonging to cold cathode emission.

For the electron source, the most important parameter is brightness, which directly determines the beam quality. At an extraction voltage of V0, the brightness may be denoted in formula (1):

$$B = \frac{I}{S \times \Omega} \propto \frac{I}{d^2 \times \alpha^2} \tag{1}$$

Where B refers to the brightness, I refers to an emission current, S refers to an equivalent emission area, d refers to an equivalent diameter, $\Omega$ refers to a solid angle, and $\alpha$ refers to an half opening angle. Further, the brightness B is proportional to an acceleration voltage $V_a$, as shown in the formula (2).

$$B \propto V_a \tag{2}$$

As can be seen from the formula (1), in order to obtain a high brightness, it is necessary to increase I and reduce $\alpha$ and d as much as possible. Moreover, the lower the extraction voltage V0 is required to obtain a certain emission current, the better the brightness is, which requires that an emission surface of the tip has a lower work function and a sharper head structure. In addition, another key parameter of the electron source is monochromaticity, which can be expressed by an energy spread $\delta E$.

Based on the above, the most ideal electron source is the cold field emission electron source (abbreviated as CFE). The brightness of CFE is higher than that of other types of electron sources by about one order of magnitude, and it has a small energy spread (~0.3 eV). In addition, in order to seek for the extreme diameter as far as possible, atomic-scale electron sources having a low work function recently have become the research hotspots, that is, the emission site consists of only one or several atoms.

In the process of implementing the concept of the present disclosure, the inventors have found that the CFE in the related art has at least the following disadvantages: firstly, the stability of the CFE is often poor, and it is required to work under extremely high vacuum ($10^{-9}$~$10^{-8}$ Pa), which severely limits the scope of application thereof. Even in such an environment, it needs to be processed regularly to obtain a more stable working state. Secondly, due to the impact of ion bombardment, the CFE is easier to be burned out. Thirdly, the aforementioned disadvantages become more serious at a greater emission current, the current CFE generally needs a total emission current of ~10 microamperes for stable operation for a long time, and the utilization rate thereof is very low. In view of the aforementioned drawbacks, the Schottky thermal-field emission source is dominant in the field of high-brightness electron sources.

SUMMARY

In view of the above, the present disclosure provides a method of manufacturing a stable electron source which have a greater field emission current and can operate at a relatively poor vacuum degree.

One aspect of the present disclosure provides a method of manufacturing an electron source, comprising: forming one or more fixed emission sites on at least one needle tip, the emission sites including a reaction product formed by metal atoms on a surface of the needle tip and gas molecules. Since the formed emission sites are the reaction product formed by the metal atoms fixed on the surface of the tip and the gas molecules, and they are rooted on the surface of the needle tip, rather than the gas molecules or dissociative particles or the like which are dissociative on the surface of the tip, it is not like the substance in the related art where the dissociative substances gather together to form a new emission site, which leads to over-current burning, thereby effectively improving the stability. In addition, the formed emission site includes the reaction product of metal atoms on the surface of the tip with gas molecules, which, compared to metal atoms or other metal compounds (for example, metal boride, etc.), has better stability in the working environment (in the presence of gas molecules), for example, it is less easy to interact or react with, for example, hydrogen in the working environment, further improving the stability of the electron source. In addition, the emission site manufactured by the method provided by the present disclosure may be a reaction product of one or several metal atoms and gas molecules, that is, an atomic-level electron source having a low work function can be formed by controlling the number of emission sites formed. In addition, the reaction product significantly reduces the surface work function, and the formation of surface emission site tapers also significantly increases the emission capability. In addition, the current value of the field emission current can be increased by manufacturing a greater number of emission sites. This makes it possible to produce a stable electron source with a large field emission current.

According to an embodiment of the present disclosure, the metal atoms are reacted with the gas molecules under an electric field to form the emission site. This facilitates the formation of the emission site at a designated location of the tip, particularly at a location that has an electric field advantage, such as a protrusion of the needle tip.

In accordance with an embodiment of the present disclosure, in one specific implementation, at least one needle tip comprises a base and one or more high-field-strength structures on the base where a field strength is higher with relative to other portions of the base, wherein an outer surface of at least one of the high-field-strength structures comprises the metal atoms, and the metal atoms on the surface of the high-field-strength structure are more likely to form a reaction product with gas molecules in the same environment by virtue of the field strength advantage, so as to preferentially form the emission site in a high-field-strength structure. In another specific implementation, at least one needle tip comprises a base and one or more active regions on the base that are more reactive than other portions of the base, wherein an outer surface of at least one of the active regions comprises the metal atom, and the metal atom on the surface of the active region is more likely to form a reaction product with the gas molecule in the same environment by virtue of the activity advantage, in order to preferentially generate an emission site in the active region. In a further specific implementation, at least one needle tip comprises a base and one or more high-field-strength structures on the base where a field strength is higher with relative to other portions of the base, at least a portion of a surface of the high-field-strength structures being an active region having a greater reaction activity, wherein the outer surface of the active region comprises the metal atoms, and the metal atom on the surface of the active region is more likely to form a reaction product with the gas molecule in the same environment by virtue of the field strength advantage and the activity advantage, thereby the emission site is formed preferentially in the active region.

According to an embodiment of the present disclosure, the high-field-strength structures include a protrusion.

According to an embodiment of the present disclosure, the protrusions have sizes ranging from sub-nanometer order to 100 nanometers order.

According to an embodiment of the present disclosure, the protrusions are formed by any one or more of the following methods: heat treatment, application of an electric field, thermal-electric field treatment, etching, or nanofabrication, or by a method of, for example, plating a layer of metal atoms on a single crystal metal tip and remolding the layer by heat treatment so as to form the protrusions.

According to an embodiment of the present disclosure, for a needle tip including a protrusion, the metal atoms of at least a portion of the surface of the protrusion has the same reaction activity as or greater reaction activity than a surface of other portions of the base in reaction with the gas molecules under a vacuum condition, that is, at least a part of the surface of the protrusion (such as a designated area) has metal atoms having a greater reaction activity than the other areas. For a needle tip including no the protrusion, the metal atoms on the surface of the active region of the base are more reactive than the surface of other portions of the base in reaction with the gas molecules under a vacuum condition.

According to an embodiment of the present disclosure, the method may further include an operation of adjusting a magnitude of a beam angle of an electron beam by adjusting size and shape of the base and/or high-field-strength structure of the tip, or adjusting the number of the emission sites by adjusting a size of the high-field-strength structure and/or the active region, or adjusting the magnitude or consistency of a voltage at which the electron source emits an current by adjusting a structure of the base and/or a structure of the high-field-strength structure, or adjusting a direction of an emission current by adjusting a shape of a top of the needle tip. This makes it easy to manufacture an electron source that meets the various needs of the user. For example, for an emission site formed on a tip protrusion formed by field etching, field evaporation, etc., when the emission current is 1 microamperes, the voltage can be lower than −0.5 KV (for example, the extraction voltage is −0.4 KV), thereby making design of the electron gun structure simpler.

According to an embodiment of the present disclosure, the gas molecules include hydrogen-containing gas molecules and any one or more of the following: nitrogen-containing gas molecules, carbon-containing gas molecules or oxygen-containing gas molecules.

According to an embodiment of the present disclosure, the hydrogen-containing gas molecules are composed of introduced hydrogen-containing gas molecules and/or composed of gas molecules remaining in a vacuum environment, and accordingly, a formation rate of the emission sites can be adjusted by adjusting an introduction rate of the hydrogen-containing gas molecules; for example, if the introduction rate of the hydrogen gas is at a higher rate, the formation rate of the emission site can be increased.

According to an embodiment of the present disclosure, the hydrogen-containing gas molecules may include hydrogen molecules, and the metal atoms may include tungsten atoms, and accordingly, the emission site is a hydrogen tungsten compound. In this way, a stable electron source having a large field emission current can be fabricated on the basis of the existing tungsten needle, and the compatibility with the related art is high.

According to an embodiment of the present disclosure, the electric field is formed by applying a bias voltage; wherein the applying a bias voltage includes any one or more of the following: applying a positive bias voltage, applying a negative bias voltage, or a combination of applying a positive bias voltage and applying a negative bias voltage. Wherein, the manner of applying the bias voltage includes, but is not limited to, directly applying a bias voltage to the tip or applying a bias voltage to a member near the tip to generate an electric field, which acts to generate a certain field strength on the tip to cause metal atoms on the surface of the tip to react with gas molecules so as to form a reaction product.

According to an embodiment of the present disclosure, if a positive bias voltage is applied, the resulting field strength includes a range from 1 V/nm to 50 V/nm, which can avoid that emission sites cannot be formed due to field etching, field evaporation, etc. caused by the positive bias voltage. If a negative bias voltage is applied, the resulting field strength include a range from 1 V/nm to 30 V/nm, which avoids excessive emission currents leading to burnt-out of the tip or change in the shape of the tip.

According to an embodiment of the present disclosure, in a case where a negative bias voltage is applied to form an emission site, the negative bias voltage is firstly applied to the needle tip to generate an emission current having a current value in an order of microamperes, then the negative bias voltage is maintained for a preset duration or is adjusted until an emission current of a predetermined value is generated, and thereafter, the negative bias voltage is adjusted to cause the electron source to emit an current of an order of less than mA, so as to avoid the needle tip from being changed in terms of molophology or burnt-out.

According to an embodiment of the present disclosure, in a case where a positive bias voltage is applied to the needle tip for forming the emission sites, the positive bias voltage is applied to the needle tip for a preset duration, the positive bias voltage having a value less than a value of a bias voltage for field evaporation for forming the protrusion.

According to an embodiment of the present disclosure, the number of formed emission sites may be adjusted by adjusting the value of the applied bias voltage or adjusting the value of the preset duration. This makes it possible to achieve an atomic-level electron source or an electron source with a large emission current.

According to an embodiment of the present disclosure, the environment for manufacturing the electron source may include any one of the following: if a temperature of the needle tip is lower than or equal to 1,000K, a pressure is less than or equal to $10^{-3}$ Pa; or if the temperature of the needle tip is higher than or equal to 500K and lower than or equal to 800K, the pressure is less than or equal to $10^{-6}$ Pa; or if the temperature of the needle tip is lower than or equal to 150K, the pressure is less than or equal to $10^{-6}$ Pa. Due to the lower formation temperature of the emission site and the lower operating temperature, the structure of the electron source will not be changed, the structure of the electron source will not be changed during operation, and the value of the applied voltage value will not be changed.

According to an embodiment of the present disclosure, the method may further include any one or more of the following operations: adjusting the uniformity of the emission sites by adjusting the number of emission sites, or adjust the magnitude of the current by adjusting the number of emission sites, or increasing the stability of the emission current by increasing the number of emission sites.

According to an embodiment of the present disclosure, the method may further include an operation of, after forming one or more fixed emission sites on the at least one needle tip, applying an electric field so that the gas molecules are adsorbed on the emission sites to remove at least one emission site.

According to an embodiment of the present disclosure, the material of the base is a conductive material, and/or the material of the high-field-strength structure is a conductive material, or the surface of the base and/or the high-field-strength structure includes the metal atoms; and/or, the high field strength structural and the base may be the same or different in material; or the material of the metal atoms on the surface of the base and/or the high-field-strength structure may the same as or different from the material of the high-field-strength structure, and if being different, the metal atoms on the surface of the base and/or the high-field-strength structure may be formed by evaporation or electroplating; or, the material of the metal atoms on the surface of the base and/or the high-field-strength structure may be the same as or different from the material of the base, and if being different, the metal atoms on the surface of the base and/or the high-field-strength structure may be formed by evaporation or electroplating.

According to an embodiment of the present disclosure, optionally, the material of the base is a conductive material and has a melting point higher than 1000 K, or the material of the high-field-strength structure is a conductive material and has a melting point higher than 1000 K, or the material of the metal atoms on the surface of the base and/or the high-field-strength structure is a metal material having a melting point higher than 1000 K, and the reaction product of the metal atoms and the gas molecules includes a reaction product of metal atoms having a melting point higher than 1000 K and gas molecules under vacuum.

According to an embodiment of the present disclosure, optionally, the high-field-strength structure or a region having high reaction activity is located at a center position on the surface of the base, or the high-field-strength structure is located on a base having a size greater than a set threshold, or the metal atom is located at a center position on the surface of the top end of the high-field-strength structure or of the base.

According to an embodiment of the present disclosure, a disappearing temperature of the emission site is lower than a minimum value of disappearance temperatures of the base, the high-field-strength structure, and the metal atom; and a disappearance temperature of the emission site is higher than the operating temperature of the electron source; or the disappearance temperature of the emission site is lower than the minimum value of the disappearance temperatures of the base, the high-field-strength structure and the metal atom, and the disappearance temperature of the emission site is higher than the maximum value of the operating temperature of the electron source and the desorption temperature of the gas molecules adsorbed on any needle tip.

According to an embodiment of the present disclosure, the size of the emission site is the order of nanometer or sub-nanometer; and by adjusting the operating voltage, the tip emission site emission current value can be on the order of 10 mA.

According to an embodiment of the present disclosure, wherein the electron source has a cold field emission characteristic, and the magnitude of the emission current can be adjusted by adjusting the extraction voltage.

BRIEF DESCRIPTION OF THE DRAWINGS

The above objects, features and advantages and others of the present disclosure will become more apparent from the description of the embodiments of the present disclosure below with reference to the accompanying drawings. In the drawings.

DETAILED DESCRIPTION OF EMBODIMENTS

Hereinafter, the embodiments of the present disclosure will be described with reference to the accompanying drawings. However, it should be understood that the description is only exemplary, and is not intended to limit the scope of the present disclosure. In the following detailed description, numerous specific details are set forth for facilitating the explanation to provide a thorough understanding of the embodiments of the present disclosure. However, it is apparent that one or more embodiments may be practiced without these specific details. In addition, the description of well-known structures and techniques is omitted in the specification in order to avoid unnecessarily misunderstanding the concept of the present disclosure.

The terms used herein are merely for the purpose of describing the particular embodiments, rather than limiting the present disclosure. The terms "comprise", "include" and the like used herein indicate the presence of the described feature, step, operation and/or component, but rather excluding the presence or addition of one or more features, steps, operations and/or components.

All the terms (comprising technical and scientific terms) used herein have the meanings commonly understood by those skilled in the art, unless otherwise defined. It should be noted that the terms used herein are to be interpreted as having meanings consistent with the context of the present specification and should not be interpreted in an ideal or too inflexible manner.

In a case where an expression like "at least one of A, B, C, etc." is used, it should generally be interpreted according to the meaning of the expression as commonly understood by those skilled in the art (for example, "an operation having at least one of A, B, and C" shall comprise, but is not limited to, an operation having A alone, B alone, C alone, A and B, A and C, B and C, and/or A, B, and C). In a case where an expression like "at least one of A, B, C, etc." is used, it should generally be interpreted according to the meaning of the expression as commonly understood by those skilled in the art (for example, "an operation having at least one of A, B, and C" shall comprise, but is not limited to, an operation having A alone, B alone, C alone, A and B, A and C, B and C, and/or A, B, and C). It should also be appreciated by those skilled in the art that transitional conjunctions and/or phrases that are arbitrarily representing two or more optional items, whether in the specification, claims, or drawings, are to be construed as the possibility of one of the items, either or both of these items. For example, the phrase "A or B" should be understood as including the possibility of "A" or "B", or "A and B".

The field emission behavior in the related art will be firstly described below in order to better understand the technical solutions of the present disclosure.

The existing electron source, such as the (310) oriented single-crystal tungsten needle tip electron source, undergoes the following three stages during use. Firstly, a clean electron source enters a stable state as the gas is adsorbed on the surface. However, as the gas is further adsorbed, current noise gradually appears and the electron source enters an unstable state, where the stability of the electron source is deteriorated and is required a flashing process (heating to about 2000° C. in a short time) to return to the stable state. If it is not flashing treated in time, surface of the electron source will gradually appear contaminants, and the emission current will start to fluctuate drastically, eventually leading to burning.

Regarding the above burnout, the inventors' further studies have shown that it is closely related to ion bombardment. This is due to the fact that the gas molecules in the surrounding space of the tip will be ionized after the electrons are emitted, and then bombard the tip. One possibility is that the surface of the tip is bombarded to form a plurality of protrusions, and the plurality of protrusions respectively serve as emission sites, which finally causes excessive current, resulting in the burnout. There is also a mechanism in which the gas molecules adsorbed to the surface of the tip or a combination thereof with other substances are continuously moved under an electric field, and finally gathered into a nano-scale protrusion as an emission site on defect points on a surface (for example, a defect point generated by ion bombardment), and the rapid growth of the emission site causes an over-current, which eventually leads to the burnout of the tip.

Further, the aforementioned problems become more serious at a greater emission current. Generally, the total emission current for stable operation for a long time is about 10 microamperes, and the utilization rate is very low. In view of the aforementioned drawbacks, the Schottky thermal-field emission source is dominant in the field of high-brightness electron sources.

Essentially, for a cold field emission electron sources, no material can avoid the effects of gas adsorption and ion bombardment. However, if the operation is under high current (>10 microamperes), the electron excitation degassing process (especially taking place at the extraction electrode bombarded by electron) will further degrade the vacuum degree, and result in poor emission stability of the tip and extremely large fluctuation, thereby failing to obtain stable operation for a long time. Therefore, how to provide a stable and large field emission current has been one of the most important challenges in the development of cold field emission electron sources.

In order to avoid the above effects of gas adsorption and ion bombardment, the current existing field emission electron source (generally referring to a metal tip) can only work in ultra-high vacuum (<$10^{-8}$ Pa), which seriously restricts the application of a cold field emission electron source. Further intensive research relating to this has been carried out by the inventors, and the following facts are found. The residual gas in the vacuum includes $H_2$, CO, and $CO_2$, but the main component thereof is $H_2$. The adsorption of $H_2$ causes the emission capability of the clean surface to gradually deteriorate. It can be concluded that in this vacuum range, the influence of $H_2$ fundamentally determines the field emission performance of the tip. Therefore, how to deal with the influence of $H_2$ becomes the key to achieve a high stability of tip. There are also some technical solutions in the related art that can alleviate the problem of gas adsorption. For example, Keigo Kasuya et al. invented a technique (mild flashings at 700° C.) by further increasing a vacuum degree of a chamber to an order of $1\times10^{-9}$ Pa, and this technique allows the W (310) surface to be always in a cleaner emission state, prolonging its use time and achieving high emission capability. The technical solution of this patent has been widely used in Hitachi's electron microscope products.

In addition, there are some technical solutions in which some dissociative particles (atomic clusters) on the surface of the tip are used as the emission sites, which is also a solution way has been attempted. These dissociative substances may be contaminants formed by prolonged placement of the tip under poor vacuum degree, and the action of the electric field allows these dissociative substances to move to a point in the tip. These emission sites have a very small beam angle (about) 5°, the extraction voltage is extremely low, and the brightness can reach more than 10 times that of the conventional W (310). Although it is not possible to form a large emission current (generally steadily giving the current of about 10 nA), it exhibits excellent stability ($<1\times10^{-7}$ Pa). One possible inference is that the very small beam angle and emission area can effectively reduce the effects of ion bombardment. However, as mentioned above, this kind of dissociative substances is not fixed, and the inventors have found that when the current is large (>1 uA), the electron source is easily burned out, and in the operation process, such substances are continuously generated, the emission state of the electron source is gradually changed, and it is difficult to maintain the emission state of the electron source for a long time. Another problem is that when it is exposed to the atmosphere, it is highly susceptible to the interference of the gas since the size of the substance is comparable with the gas molecules.

Based on the above various analyses, inferences, and experiments, the inventors provide a method of manufacturing an electron source according to the present disclosure, so as to provide an electron source, which can operate stably over a long time, can provide a greater field emission current, can work in a poorer vacuum environment, and can be also less susceptible to the interference of the gas even it is exposed to the atmosphere.

According to the method of manufacturing the electron source provided by the present disclosure, one or more fixed emission sites are formed on at least one needle tip, and the emission sites include a reaction product of metal atoms on the surface of the needle tip with gas molecules. The metal atoms on the surface of the tip are fixed on the surface of the tip. Since the metal atom on the surface of the tip is used as a reaction substance, a reaction product formed by the metal atom with the gas molecule is rooted on the surface of the needle tip; and since the reaction product is a reaction product formed by reaction between the metal atom and the gas molecule under a condition similar to the working condition, the reaction product will has a less reaction activity of reacting again with the gas molecule, and thus has a higher stability. Further, since the amount of the reaction products can be controlled, it is possible to provide a large field emission current by increasing the amount of the reaction products. In addition, since the reaction product is a reaction product formed by the reaction of a metal atom with a gas molecule, it is less susceptible to gas interference even when exposed to the atmosphere.

The above-mentioned emission sites can be formed by applying an electric field to bring reaction between a metal atom with a gas molecule.

In one embodiment, the electric field is formed by applying a bias voltage; wherein applying a bias voltage includes any one or more of the following: applying a positive bias voltage, applying a negative bias voltage, or a combination of applying a positive bias voltage and applying a negative bias voltage. The reaction product formed by the application of the electric field to the metal atoms on the surface of the tip and the gas molecules can be implemented in various ways. For example, a voltage is applied directly to the tip of the needle to form a high field strength on the surface of the tip so as to promote reaction of the metal atoms on the surface of the tip with the gas molecules, forming the reaction product; it is also possible to apply a voltage to a field strength generating structure (such as an electrode) near the tip to form an electric field, thereby forming a high field strength on the surface of the tip to promote reaction of the metal atoms on the surface of the tip with the gas molecules so as to form the reaction product. In short, the field formed on the surface of the tip and the manner in which the field is formed are not limited herein as long as a field can be formed on the surface of the tip, which can cause the metal atoms on the surface of the tip to react with surrounding gas molecules to form a reaction product.

Hereinafter, an example will be described in which an emission site is formed on the surface of a tip of a needle by applying a bias voltage to the tip of the needle to form an electric field.

Figure 1:
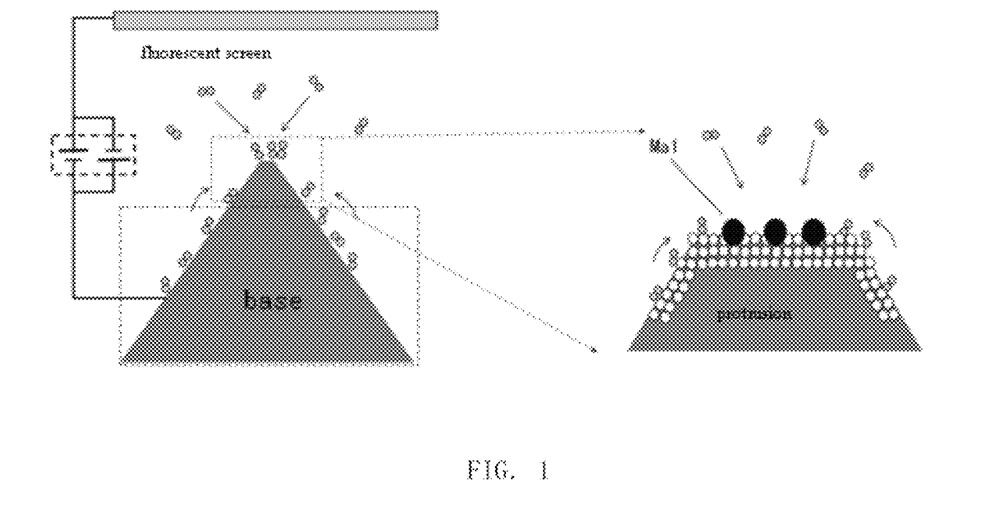
FIG. 1 is a schematic view showing a process of manufacturing an electron source according to an embodiment of the present disclosure.

FIG. 1 schematically shows a schematic diagram of a process of manufacturing an electron source according to an embodiment of the present disclosure.

As shown in FIG. 1, it can be seen from the left picture of FIG. 1 that after the bias voltage is applied to the tip, the gas molecules on the surface of the tip and in the environment will continuously move to a position having a high field strength, and then, under action of the high electric field, at least a portion of the metal atoms on the surface of the tip are caused to form a reaction product, i.e., an emission site, with the gas molecules. The picture on the right side is an enlarged view of the picture in the dashed box in the left picture, and the dashed box at the bottom of the left picture indicates a schematic base. As can be seen from the left figure, after applying a bias voltage to the tip, due to the strongest field strength at the top end of the needle tip, such as at the protrusion, the gas molecules in the environment and the gas molecules adsorbed on the surface of the tip (grey dots in the left picture) will be gradually accumulated toward the top end of the needle tip, which is one of reasons of the decrease in the emission capability of the electron source of the tungsten monocrystalline in the related art. As can be seen from the right picture, as the gas molecules accumulate at the tip of the electron source, a field (such as an electric field, etc.) is formed at the tip of the needle to cause the gas molecules to form a reaction product (black dot, that is an emission site, referred to as Ma1 for short) with the metal atoms (white dots) on the surface of the tip, and the emission site is rooted on the surface of the tip rather than being free on the surface of the tip.

Figure 2:
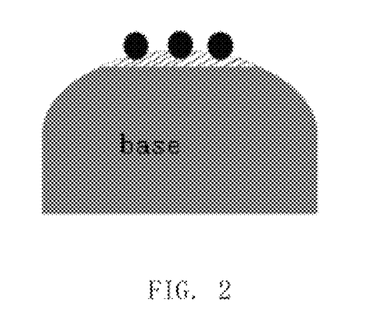
FIG. 2 is a schematic view showing a manufacturing process of an electron source according to another embodiment of the present disclosure.

FIG. 2 schematically shows a schematic diagram of a process of manufacturing an electron source according to another embodiment of the present disclosure.

As shown in FIG. 2, the shaded portion in the figure indicates a region having a greater reaction activity, and an emission site is formed in the large-reaction activity region. Specifically, the surface of the large-reaction activity region may be composed of metal atoms which are highly reactive with gas molecules, such that these metal atoms may preferentially react with gas molecules to form reaction products under the action of an electric field so as to form emission sites in a specified region, as indicated by the black dots shown in the figure.

Figure 3A:
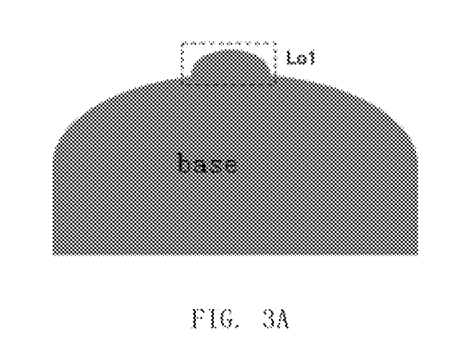
FIG. 3A schematically illustrates a schematic diagram of a tip structure for forming an emission region in accordance with an embodiment of the present disclosure.

FIG. 3A schematically illustrates a schematic diagram of a tip structure for forming an emission region in accordance with an embodiment of the present disclosure.

As shown in FIG. 3A, at least one of needle tips includes a base and one or more high-field-strength structures on the base where a field strength is higher with relative to other portions of the base, wherein at least one of the high-field-strength structures includes metal atoms on an outer surface thereof. The base may be a portion close to a top end of the needle tip, or may be a conductive material or the like additionally formed on the surface of the tip.

Figure 3B:
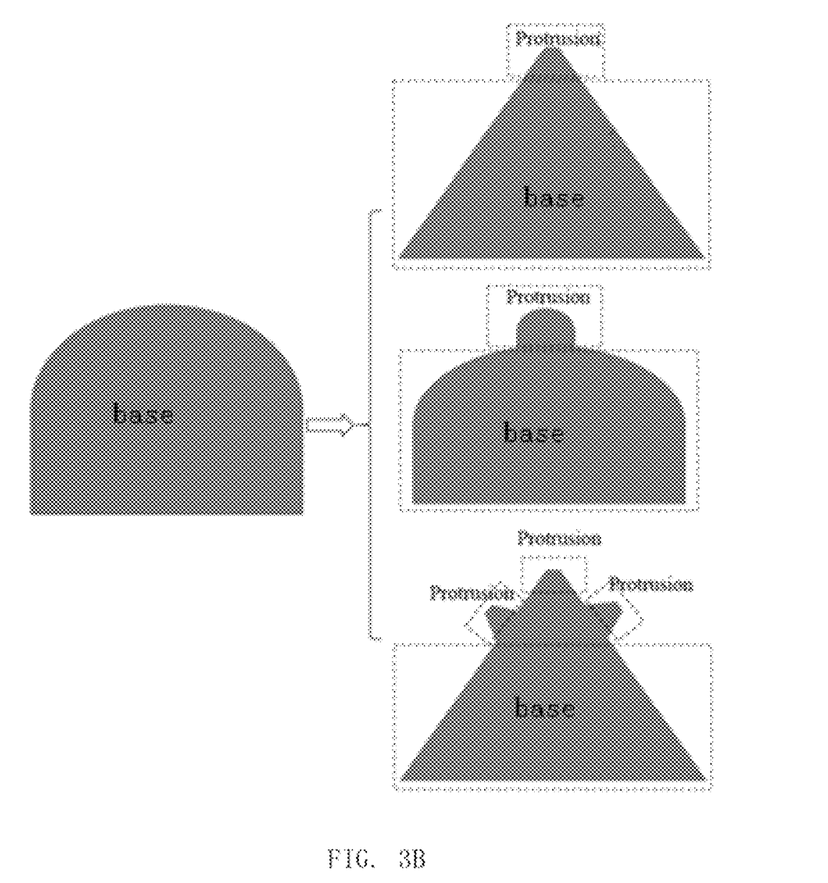
FIG. 3B schematically illustrates a schematic diagram of a high-field-strength structure in accordance with an embodiment of the present disclosure.

FIG. 3B schematically illustrates a schematic diagram of a high-field-strength structure in accordance with an embodiment of the present disclosure.

As shown in FIG. 3B, the shape of the high-field-strength structure may be a pointed cone shape, a mesa shape, an ellipsoid shape, a hemisphere shape, etc., and the number of high-field-strength structures may be 1, 3, 5, 10 or the like, which will not be limited herein.

It should be noted that the high field strength structure and the base may be made of the same or different material. Furthermore, the material of the metal atoms on the surface of the base and/or the high-field-strength structure may the same as or different from the material of the high-field-strength structure, and if being different, the metal atoms on the surface of the base and/or the high-field-strength structure may be formed by evaporation or electroplating. In addition, the material of the metal atoms on the surface of the base and/or the high-field-strength structure may be the same as or different from the material of the base, and if being different, the metal atoms on the surface of the base and/or the high-field-strength structure may be formed by evaporation or electroplating. In addition, the material of the base and the material of the high-field-strength structure may the same as or different from the material of the body of the tip, which will not be limited herein.

As shown in FIG. 3B, the high-field-strength structure may include a protrusion corresponding to the Lo1 position shown in FIG. 3A. In an example, the protrusion may have a size of sub-nanometer order to 100 nanometers order. Due to the high field strength advantage of the protrusion, when a voltage is applied to the tip, at least a portion of the metal atoms on the surface of the protrusion will form a reaction product with the gas molecules under the action of the field strength. This makes it easy and quick to form an emission site at a specified location on the surface of the tip. Further, the number of emission sites formed on the protrusions can be controlled, for example, more emission sites can be formed by increasing the time length of the applied bias voltage or increasing the size of the protrusions to increase the emission current, or the like.

The protrusions are formed by any one or more of the following methods: heat treatment, application of an electric field, heat-electric field treatment, etching, or nano-machining, or the like, or a method of, for example, plating a layer of metal atoms on a single crystal metal tip and reshaping the layer of metal atoms by heat treatment to form protrusions. It should be noted that any method capable of forming a protrusion on the surface of the needle tip is applicable and will not be limited herein.

Optionally, the material of the base is an electrically conductive material, the material of the high-field-strength structure is a conductive material, and the surface of the base and/or the high-field-strength structure is made of metal atoms. In an example where the type of the above metal atom is different from the type of that of the tip body or the base, different kinds of metal atoms may be formed on the surface of the needle tip by evaporation, electroplating or the like. Preferably, the material of the base and the material of the high-field-strength structure have a melting point higher than 1000 K, the melting point of the material of metal atom is higher than 1000 K, thereby obtaining a better stability, and it facilitates performing a heat treatment by using a flashing (short-time high-temperature heating) technique so as to clean the needle tip. For example, the metal material may include any one or more of the following: tungsten, tantalum, niobium, molybdenum, rhenium, hafnium, iridium, osmium, rhodium, ruthenium, . . . , platinum, palladium, gold, chromium, vanadium, zirconium, titanium, or a metal hexaboride; for example, a certain kind of metal atoms alone serves as metal atoms on the surface of the tip, or a laminated layer is formed by several kinds of metal atoms, such as a laminated layer formed from a titanium layer, a platinum layer, a tungsten layer, or the like, or a non-monolithic metal layer formed by mixing several kinds of metal atoms, which will not be limited herein. In a preferred embodiment, the metal atoms include tungsten atoms, the gas molecules include hydrogen, and correspondingly, the emission site is a hydrogen tungsten compound.

Figure 3C:
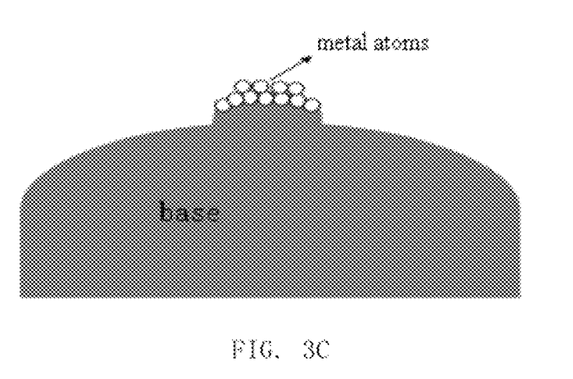
FIG. 3C schematically shows a schematic view of metal atoms on a protrusion surface in accordance with an embodiment of the present disclosure.

FIG. 3C schematically illustrates a schematic view of metal atoms on a protrusion surface in accordance with an embodiment of the present disclosure.

It should be noted that the materials of the base, the high-field-strength structure and the body of the tip may be all metal materials or non-metal materials (as long as they are conductive materials), and if the electron source does not include the high-field-strength structure, it is only required to ensure that the surface of the base includes metal atoms having a large reaction activity, and that an electric current can be introduced through the base; if the electron source includes a high-field-strength structure, it is only required to ensure that the surface of the high-field-strength structure includes metal atoms, and that an electric current can be introduced through the high-field-strength structure.

In a preferred embodiment, the high-field-strength structure is located at a center position on the surface of the base, and/or the high-field-strength structure is located on a base having a size greater than a set threshold, such as a base having a greater size, and/or the metal atom is located at a center position on the surface of the top end of the high-field-strength structure.

Furthermore, the magnitude of a beam angle of an electron beam can be adjusted by adjusting the size and shape of the base and/or high-field-strength structure of the tip, and the number of the emission sites can also be adjusted by adjusting the size of the high-field-strength structure and/or the active region. The amplitude or consistency of the voltage for emitting an emission current of the electron source can also be adjusted by adjusting the structure of the base and/or the high-field-strength structure, and the direction of the emission current can be adjusted by adjusting the shape of the top of the tip. For example, if the size of the base is increased, the beam angle will be decreased; if the field evaporation causes the height of the protrusion to decrease, then the beam angle reduces; the smaller the size of the protrusion is, the smaller the number of the emission sites is; or the like. Among others, the extraction voltage can be lower than −0.5 KV, for example the extraction voltage is −0.4 KV.

Figure 4:
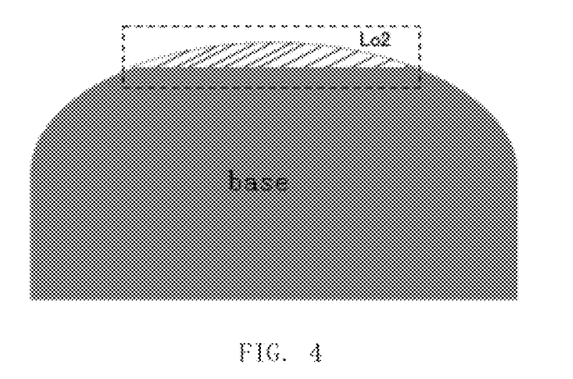
FIG. 4 schematically illustrates a schematic diagram of a tip structure for forming an emission region in accordance with another embodiment of the present disclosure.

FIG. 4 schematically illustrates a schematic diagram of a tip structure for forming an emission region in accordance with another embodiment of the present disclosure.

As shown in FIG. 4, at least one of the tips comprises a base and one or more active regions on the base having a greater reaction activity than other portions of the base, corresponding to the Lo2 position, wherein an outer surface of at least one of the active regions include metal atoms. The active region is shown in the shaded region of FIG. 4. The number of the active regions may be 1, 3, 5, 10, etc., which will not be limited herein, and the emission sites may be preferentially formed in the active region located at the top region of the tip.

It should be noted that for a tip not including any protrusion, the metal atom on the surface of the active region of the base is more reactive than that on other portions of the surface of the base in reaction with gas molecules under vacuum condition. The material of the base and the material of the body of the tip may be the same or different from each other. The metal atoms in the active region may be formed by evaporation, electroplating or the like, for example, a certain area of metal atom layer is formed at the intersection of the axis of the tip and the surface by electroplating, the material of the metal atom layer has higher reaction activity with gas molecules, compared with the material of other surfaces of the base. Accordingly, the metal atoms on the surface of the active region of the base have greater reaction activity than that of other portions of the surface of the base in reaction with gas molecules under a vacuum condition.

In a preferred embodiment, the active region having the greater reaction activity is located at a central position on the surface of the base; or, the metal atoms are located at a central position on the surface of the base.

In the electron source provided by the present disclosure, at least one of the tips comprises a base and one or more active regions on the base having greater reaction activity than those of other portions of the base, and an outer surface of at least one of the active regions includes metal atoms. The metal atoms on the surface of the active region are more likely to react with the gas molecules to form a reaction product in the same environment by virtue of the reaction activity advantage, so as to preferentially generate the emission site at the active region.

Figure 5:
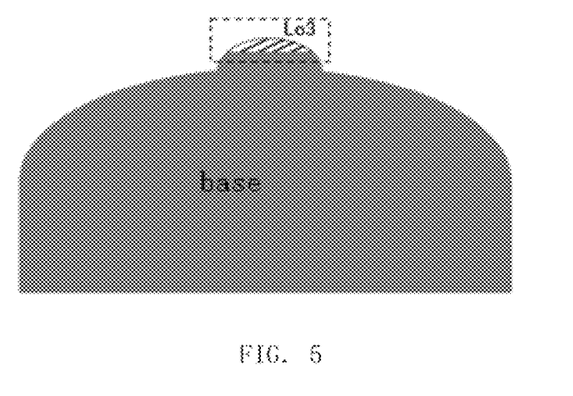
FIG. 5 schematically illustrates a schematic diagram of a tip structure for forming an emission region in accordance with another embodiment of the present disclosure.

FIG. 5 schematically illustrates a schematic view of a tip structure for forming an emission region in accordance with another embodiment of the present disclosure.

As shown in FIG. 5, at least one of the tips comprises a base and one or more high-field-strength structures located on the base having a higher field strength than those of other portions of the base, at least a portion of a surface of the high-field-strength structure is an active region having a greater reaction activity, corresponding to the Lo3 position, and an outer surface of the active regions is provided thereon with metal atoms.

In this embodiment, for the tip comprising a protrusion, metal atoms on at least a portion of the surface of the protrusion have the same or greater reaction activity than that of other portions of the surface of the base in reaction with gas molecules under a vacuum condition. In this way, it is possible to more precisely control the formation of the emission site in a designated region of the protrusion, for example, an emission site is formed in the shaded region on the protrusion of FIG. 5. The forming manner in which the metal atoms on the surface of the active region are formed may refer to the forming manner of the active region in the previous embodiments, which will not be repeatedly described in detail herein.

In the electron source provided by the present disclosure, at least one of the tips comprises a base and one or more high-field-strength structures located on the base having a higher field strength than those of other portions of the base, at least a portion of surface of the high-field-strength structure is an active region having a greater reaction activity, and an outer surface of the active region is provided thereon with metal atoms. The metal atoms on the surface of the active region are more likely to react with the gas molecules to form a reaction product in the same environment by virtue of the field strength advantage and the reaction activity advantage, so as to preferentially generate the emission site at the active region.

Figure 6:
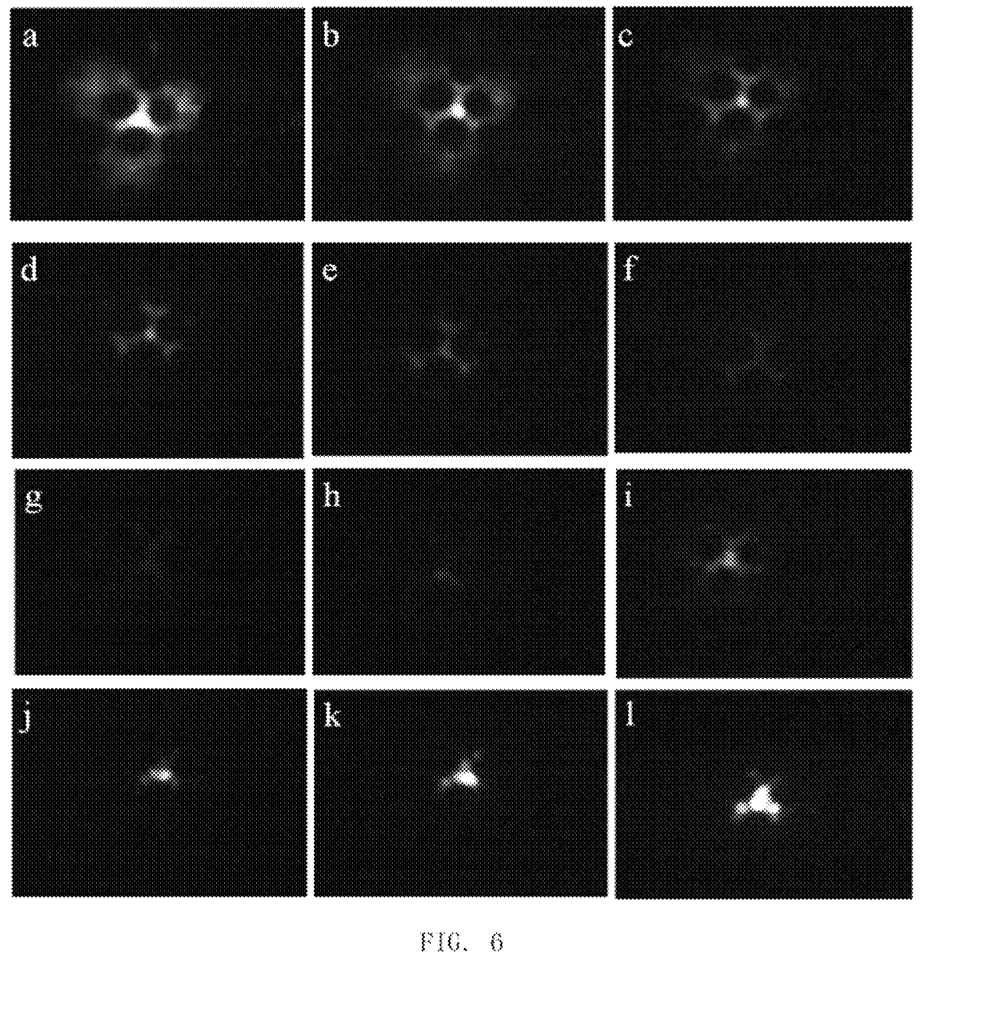
FIG. 6 schematically shows a schematic diagram of a process of forming an emission site according to an embodiment of the present disclosure.

FIG. 6 schematically shows a schematic diagram of a process of forming an emission site in accordance with an embodiment of the present disclosure.

The emission site Ma1 is formed by the reaction of gas molecules and metal atoms on the surface under the action of a strong electric field, which is conducted at a certain temperature. The formation process of the emission site is based on an in-depth study of a hydrogen adsorption behavior in a small region of the surface of the tip.

In one embodiment, in a case where a negative bias voltage is applied to form an emission site, the following operations may be included: firstly, applying a negative bias voltage to the tip to generate an emission current having a current value of an order of microamperes; then, maintaining the negative bias voltage for a preset duration, or adjusting the negative bias voltage until a predetermined value of the emission current is generated; thereafter, adjusting the negative bias voltage such that the emission current of the electron source is in an order less than a milliampere, preventing the shape of the tip from being changed or burned.

In another embodiment, in a case where a positive bias voltage is applied to form an emission site, the positive bias voltage is applied to the tip and maintained for a predetermined period of time, the value of the positive bias voltage being less than the value of a bias voltage for field induced evaporation for forming the protrusion.

First, a tip of a tungsten single crystal (111) is provided, and a protrusion is formed on the tip by the method as described above, for example, the tip undergoes a flashing process (being heated to 1,200K for 3 s, during which a bias voltage may be additionally applied). In this way, a nano-scale protrusion may be formed at a central position of the surface of the tip, and the surface thereof is clean. Referring to FIG. 6a, in a case where a negative voltage is applied to the tip up to −2 KV, a field electron emission mode is obtained. To avoid the effects of ion bombardment, the formation temperature of the emission site Ma1 is about 50K. In the entire formation process of the emission site, the emission current ($I_E$) is always controlled within 5 nA and the vacuum degree is maintained at $10^{-7}$ Pa.

As shown in FIG. 6b to FIG. 6e, the gas adsorption first causes a decrease in the emission capability, such that the emission pattern on the display interface of the fluorescent screen assembly appears gradually darkened, and the emission current is gradually decreased, that is, the emission capability of the existing tungsten cleaning surface is gradually decreased.

As shown in FIG. 6f, the emission pattern disappears almost completely over time, and at this time, the emission capability of the conventional tungsten cleaning surface almost completely disappears.

As shown in FIG. 6g, as the bias voltage is continuously applied to the electron source, the emission site of the present disclosure begins to form, and the composition of this emission site is different from that of the previous emission substance. In a case where tungsten is taken as an example for description, the previous emission substance is tungsten atoms of tungsten single crystal, and this emission site is a reaction product of tungsten atoms on the surface of the tip with gas molecules, for example, a reaction product of tungsten atoms with hydrogen molecules. This reaction product is fixed on the surface of the tip.

As shown in FIG. 6h to FIG. 6k, as the bias voltage is continuously applied to the electron source or maintained for a period of time, the emission site eventually becomes brighter.

As shown in FIG. 6l, the emission site with high emission capability is finally formed, and the emission current is further increased. By comparing FIG. 6a with FIG. 6l, it can be clearly seen that the emission capability of the emission site is obviously improved, and the emission sites are more concentrated at the central protrusion position.

In the above process, since the current is always controlled to be very small, and the fluorescent screen is far away from the tip, and the vacuum degree is good, the influence of ion bombardment may be excluded. In addition, applying a positive high voltage can form a substance having the same field emission characteristic. At this time, there is no emission current at all, indicating that the dissociative atomic-scale particles caused by the ion bombardment do not participate in the formation process of the emission site Ma1.

In the formation process of the emission site Ma1, the gas (for example, $H_2$) is adsorbed, dissociated under the electric field, and further combined with the metal atoms on the surface to form a certain H—W reaction product (compound), which belongs to a kind of Ma1. It seems that this kind of compound is directly bonded to the surface and does not move. Similar substances can be formed at other positions, but they do not move and are always stable emission sites.

Among the parameters related to the emission capability, the emission capability of a single emission site can reach more than 30 uA, which significantly exceeds the stable emission capability of the existing CFE (~10 microamperes). If a dense emission region is formed and the emission patterns are connected into one piece, then the total current can reach an order of 100 uA. If the emission area is increased, the emission current in an order of a milliampere can be achieved.

Different emission capacities are achieved at different vacuum degrees. In general, a high emission current can be maintained at a high vacuum degree, and the maximum emission current is rapidly attenuated at a low vacuum degree. The tip terminated by the emission site has field emission consistency, that is, the voltage of the emission current is consistent; for example, in a case where the emission current is one microampere, the voltage is −1.2±0.1 KV.

The following is an exemplary illustration of a complete manufacturing process.

(1) Regarding Manufacturing Conditions

The emission site is a reaction product that is generated by reaction of metal atoms on the surface of the tip with gas molecule under the action of an electric field in a vacuum environment and at a temperature in a certain range. The electric field may be an electric field formed by applying a positive bias voltage or a negative bias. For example, in a case where a positive bias voltage is applied, the field strength would be 1 to 50 V/nm; in a case where a negative bias voltage is applied, the field strength would be 1 to 30 V/nm.

Specifically, the manufacturing apparatus may include a vacuum chamber, a cooling head (the cooling head may include a heating device), a sample holder, a heating sheet, a power source, a gas introducing device, and a fluorescent screen assembly, wherein the vacuum chamber has a background vacuum of less than or equal to $10^{-3}$ Pa (generally, less than $10^{-6}$ Pa). There is an insulative sample holder on the cold head. It is possible to dispose a heating device (such as a heating plate and a heating rod) on the sample holder, such that the temperature can be adjusted between 10K and 500K. A pretreated tip (such as a tungsten single crystal tip, which may be a tip having a protrusion, the size of the protrusion being of an order of nm or sub-nm, or a needle tip having a relatively high reactive region) is placed on the sample holder, and a voltage is applied to the tip, where the voltage may be a positive high voltage $V_P$ or a negative high voltage $V_N$. The power supply may be a dual output high voltage power supply with an output range of ±0~30 kv. The gas introduction device is used for introducing reaction gas molecules, such as $H_2$, or other reaction gases, such as H-containing gas, water, $CH_4$, etc., and the gas introduction amount can be dynamically adjusted, and the vacuum degree is generally smaller than $10^{-4}$ Pa during introduction (it is noted that the residual gas molecules in the chamber may be directly used, and the main component thereof is hydrogen gas). Specifically, the gas molecules include hydrogen-containing gas molecules and any one or more of the following: nitrogen-contained gas molecules, carbon-contained gas molecules or oxygen-contained gas molecules. Further, the rate of formation of the emission site can be adjusted by adjusting the introduction rate of the hydrogen-containing gas molecules. The fluorescent screen assembly is used to convert the particle beam image into a light image. When the signal is small, the signal can be amplified by using a screen-multichannel plate assembly. When a voltage is applied to the tip, the particle beam can be extracted, and the applied voltage may be a positive voltage or a negative voltage; if a positive voltage is applied, the positive ion beam is output when the imaging gas is output; the electron beam is output if the negative voltage is applied. Due to lower temperatures for formation and operation of the emission site, the structure of the electron source is not changed during operation, and the applied voltage value is not changed, so that the voltage value is stable to make the design of the electron gun simpler.

(2) Regarding the Manufacturing Process

1. A high-field-strength structure is firstly formed. The process of forming the high-field-strength structure may include the following operations.

A region where the field strength is strong, such as a protrusion, is formed on the surface of a needle tip, and preferably, a protrusion is formed at the center of the tip.

The material of the protrusion may be the same as the base or may be different from the base. For example, the material of the protrusion is a conductor, and one or several layers of atoms on the outermost surface of the protrusion are metal atoms, and the size of the protrusion is of an order of nm or sub-nm, and the protrusion can be formed by electrochemical etching, field ion etching, heat treatment, or application of an electric field, nanofabrication, or a combination of one or more thereof, or for example, by plating a layer of metal atoms on a single crystal metal tip and reshaping the layer by heat treatment to form the protrusion.

2. The needle tip is placed in a suitable vacuum environment which contains specified elements, which may specifically include the following operations.

After the needle tip is placed in the vacuum chamber, vacuuming is performed, and then the gas is introduced, which may be $H_2$, $N_2$, a gas containing H element, for example, mainly $H_2$ or a gas containing H element, and the rate of forming the emission sites may be affected by adjusting the amount of gas molecules. In addition, the gas may also be a residual gas in the vacuum chamber, such as $H_2$, $H_2O$, CO, $CO_2$, or the like. The degree of vacuum of the chamber would be less than $10^{-3}$ Pa, and preferably, the degree of vacuum may be less than $10^{-6}$ Pa.

3. The temperature of the tip may be adjusted before applying a bias voltage. The tip temperature would be lower than 1,000K; preferably, the low temperature for the tip is lower than 150K, and the high temperature for the tip is in the range of 500~800K; if the tip temperature is higher than 1000K, the formed emission site would be removed. As shown in Table 1, the formation conditions of the emission site are listed.

TABLE 1

Table of Formation Conditions of Emission site

| Temperature | Electric Field | |
|---|---|---|
| | Negative Bias Voltage | Positive Bias Voltage |
| Low temperature below 150 K | YES | YES |
| Room temperature | YES | YES |
| High temperature of 500~800 K | YES | YES |

For example, when the tip temperature is lower than or equal to 1,000K, the pressure is lower than or equal to $10^{-3}$ Pa; or, if the tip temperature is higher than or equal to 500K and lower than or equal to 800K, the pressure is lower than or equal to $10^{-6}$ Pa; or if the tip temperature is lower than or equal to 150K, the pressure is lower than or equal to $10^{-6}$ Pa. Due to lower temperatures for formation and operation of the emission site, the structure of the electron source will not be changed during operation, and the value of the applied voltage will not be changed.

4. A bias voltage is applied to the tip. Under the action of the electric field, the gas molecules react with metal atoms on the surface of the high-field-strength structure (such as a protrusion) so as to form an emission site rooted on the surface, and the applied bias voltage may be a positive bias voltage or a negative bias voltage, or a combination of them.

In an example, if a positive bias voltage is applied, the applied positive bias voltage would be lower than a voltage for field evaporation, the field strength would be 1~50 V/nm; if a negative bias voltage is applied, the applied negative bias voltage would be low than a burn-out voltage, and the field strength would be 1~30 V/nm. In addition, if applying a negative bias voltage, the voltage may be adjusted in time to prevent the shape of the tip from being changed or burned due to excessive current. Generally, the current of the tip may be controlled to be less than the mA level.

In a specific embodiment, the formation of an emission site under the action of a negative bias voltage is taken as an example for explanation. First, a pre-treated tip (such as a tip having a protrusion and a clean surface) is placed in a vacuum environment, preferably with a vacuum of 1 $E^{-7}$ Pa. The temperature of the tip is adjusted such that it is lower than 1,000K, and preferably is a lower temperature lower than 150K or a high temperature in a range of 500~800K. If the tip temperature is higher than 1,000K, the formed emission site will be removed.

Then, a negative bias voltage is applied to the tip, and under the action of the electric field, the gas molecules or the ions adsorbed on the surface of the tip continuously move to a specific region of the tip, and the specific region may be a high field strength structural region and/or a greater-reaction activity region.

Then, when the negative bias voltage is applied up to a certain value (such as −3 KV), the gas molecules react with metal atoms (such as tungsten) on the surface of the tip to form an emission site, generating a small emission current, for example, less than 1 μA, and as the emission site continues to be formed, the number of emission sites gradually increases and the total emission current gradually increases, for example, up to 1 μA to tens of μAs.

Then, with continuing to wait or adjusting the voltage, the emission current will be greatly increased to hundreds of μA~1 mA, it is required to quickly reduce or cut off the negative bias voltage in time, so as to avoid burnout of the tip; in general, the current is controlled to be of an order of less than mA, and by slowly applying a negative high voltage multiple times, a predetermined emission current could be obtained.

It should be noted that in the above process of applying a negative bias, if the tip includes a protruding structure as shown in FIG. 3B (such as a super-needle structure obtained by applying a positive bias voltage to the needle tip through field etching, that is, the tip has been applied with a positive bias voltage), then when the negative bias voltage is applied to a certain value (such as −1.2 KV), the gas molecules can react with metal atoms (such as tungsten) on the surface of the tip to form an emission site, generating a small emission current, for example, less than 1 μA; the voltage can be increased to continuously form the emission site. The emission current can be increased to be tens of μA (such as 30 μA); thereafter, with continuing to wait or increasing the voltage, the field emission site continues to be formed; the number of field emission sites gradually increases, and the total emission current gradually increases. The protruding structure is a super-needle structure obtained by applying a positive bias voltage to the needle tip through field etching. When the voltage of the field etching is consistent, the voltage of emitting the emission current can be made to be consistent; for example, if the field etching voltage is +8 KV, forming a protrusion, the voltage of emitting stable emission current is −1 KV.

Referring to FIG. 6, the process of forming the emission site on the cleaning surface of the protrusion of the tip made of W (111) is as follows: the tip temperature is about 50K, the degree of vacuum is $10^{-7}$ Pa; a negative bias voltage is applied to the tip, the field emission pattern of the clean surface of the protrusion on the tip of the W (111) is shown in FIG. 6a. A test is carried out. Under the action of the electric field, the gas molecules move toward the position of protrusion; due to the gas adsorption, the field emission pattern is continuously darkened or even completely disappeared, as shown in FIGS. 6a to 6g. The negative bias voltage is continuously maintained, so that under the action of a certain electric field, the gas molecules react with the metal atoms on the surface of the protrusion to form an emission site rooted on the surface.

In another embodiment, the description is made by taking an example of forming an emission site under a positive bias voltage. First, A pretreated needle tip is placed in a vacuum environment, preferably, the degree of vacuum is 1 $E^{-7}$ Pa; the tip has a clean surface, and the temperature of the tip is adjusted, such that the tip temperature is lower than 1,000K; if the tip temperature is higher than 1000K, the formed emission site would be removed.

Then, a positive bias voltage (e.g., +8 KV) is applied to the tip for a certain period of time (e.g., 2 minutes); the value of the positive bias voltage is less than the voltage for field evaporation. Under the action of the electric field, the gas molecules continuously move to a specific area of the needle tip, and the reaction occurs and a reaction product is formed as an emission site. The positive bias voltage and the negative bias voltage have the same function for obtaining a certain field strength. In an example, the value of the positive bias voltage or the maintenance time can be adjusted to adjust the number of the formed emission site.

Figure 7:
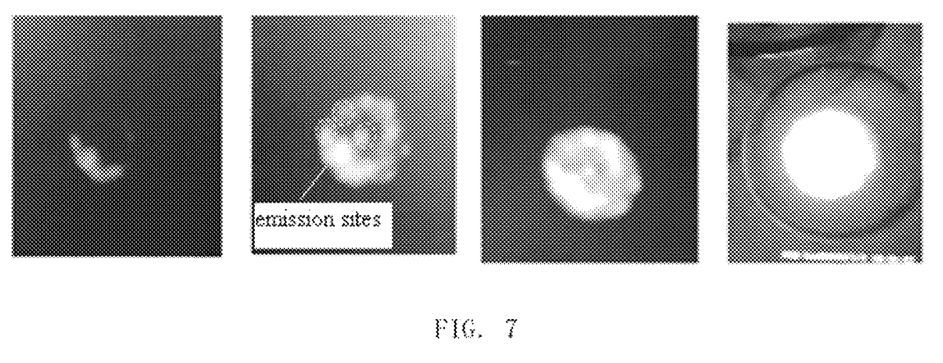
FIG. 7 schematically illustrates a process diagram of applying a positive bias voltage to form an emission site in accordance with an embodiment of the present disclosure.

FIG. 7 schematically illustrates a process diagram of applying a positive bias voltage to form an emission site in accordance with an embodiment of the present disclosure.

Referring to FIG. 6, in a case where a positive bias voltage is applied, the emission pattern of the clean surface as shown in FIG. 6a and the process in which the emission patterns of the clean surface become dark as shown in FIGS. 6a to 6f may not be observed, and only the formation process of the emission site as shown in FIGS. 6g to 6l may be observed. As shown in FIG. 7, for example, in the embodiment in which the emission sites are formed on the surface of the protrusion structure as shown in FIG. 3A, the emission site is directly formed after the application of the positive bias voltage. In use, a negative bias voltage is applied to the tip, up to a certain value, for example −1.2 KV, the field emission site that has been formed will emit current.

It should be noted that during the formation of the field emission site, since the current is always controlled very small, the screen is far away from the needle tip, and the degree of vacuum is good, the influence of ion bombardment can be excluded. In addition, the positive high voltage can also be used for form a substance having the same field emission characteristics, and at this time there is no emission current at all, which indicates that the dissociative atomic-level particles caused by ion bombardment do not participate in the formation of the emission site. Therefore, during the formation of the emission site, gas molecules (such as $H_2$) are adsorbed, dissociated under the electric field, and further combined with surface metal atoms (such as tungsten atoms) to form a certain H—W reaction product. The compound appears to be directly bonded to the surface of the tip and does not move. For example, other locations of other tips can form similar substances, but they do not move and remain at a stable position. In general, if the degree of vacuum is high, the current is large, and if the degree of vacuum is low, the maximum emission current is rapidly attenuated.

Figure 8:
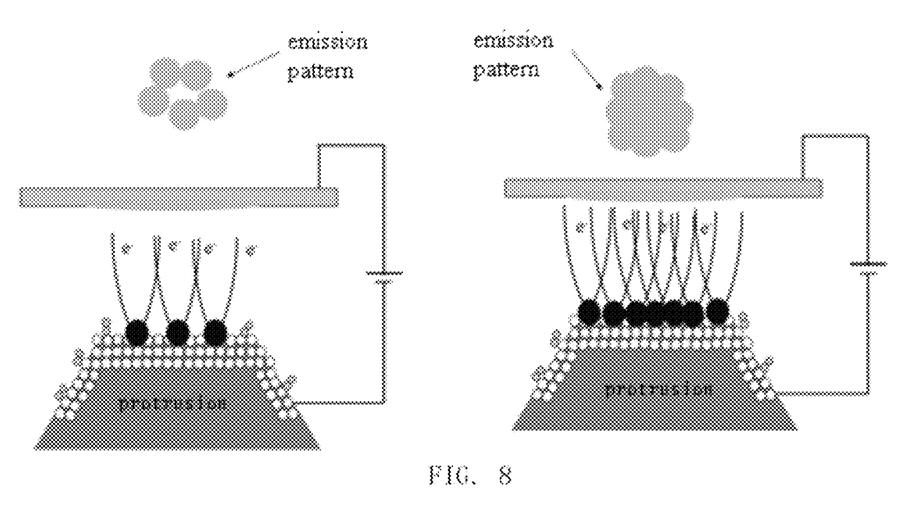
FIG. 8 schematically shows a schematic diagram of the relationship between the number of emission sites and the uniformity of emission patterns according to an embodiment of the present disclosure.

FIG. 8 schematically shows a schematic diagram of the relationship between the number of emission sites and the uniformity of emission patterns according to an embodiment of the present disclosure.

It can be seen from the figure that there is a correspondence between the number of emission sites and the uniformity of the emission pattern, and the more the emission sites, the more uniform the emission pattern is. The uniformity of the emission pattern can be increased by increasing the number of emission sites. Specifically, the protrusions can accommodate more emission sites by increasing the size of the protrusions. For example, if the protrusions have the same surface area: the emission current is small and the pattern is nonuniform when the number of emission sites is small (left Figure of FIG. 8); and the emission current is large, and the pattern is uniform when the number of emission sites is large (right Figure of FIG. 8).

The electron source manufactured by the method of manufacturing an electron source provided by the present disclosure has an emission site with high emission capability, and has the advantages of small emission site area, small energy spread, and stability, wherein a single emission site is formed at a level of nm or sub-nm. The tip terminated by emission site is a field emission electron source that can be used to extract and control current by adjusting the voltage. For example, the emission current of a single emission site can reach more than 30 uA. If a dense emission area is formed, the emission sites are connected into one piece, and the total current can reach the order of 100 uA. If the formation area is increased, the current of the mA level can be achieved. Different emission capacities could be achieved at different vacuum levels.

In addition, when the current is relatively large, a single emission site will flicker at the same position (repeating disappearing and appearing again), so the stability of the current can be increased by increasing the number of emission sites. A surface of the emission site just newly formed by the reaction is clean with no gas adsorbed, and the emission site has the largest emission capacity. When the emission sites continue working, as the gas will continue to be adsorbed on the emission site, the emission ability will decrease or even disappear. This feature can be used to remove unwanted emission sites, for example, some of the surrounding emission sites. Therefore, the method can also include the following operations: after forming one or more fixed emission sites on at least one of the needle tips, applying an electric field to the tip so that the gas molecules are adsorbed on the emission sites to remove at least one emission site. For example, by applying a voltage to the electron source to form an electric field, the gas molecules are adsorbed to the emission site by the electric field so that at least one of the emission sites does not emit any current.

The above example is described by taking an electron source having a high-field-strength structure as an example. However, the formation process of the above-mentioned emission site is also applicable to an electron source having a region having a large reactive activity, and the details thereof will not be repeatedly described herein.

Figure 9:
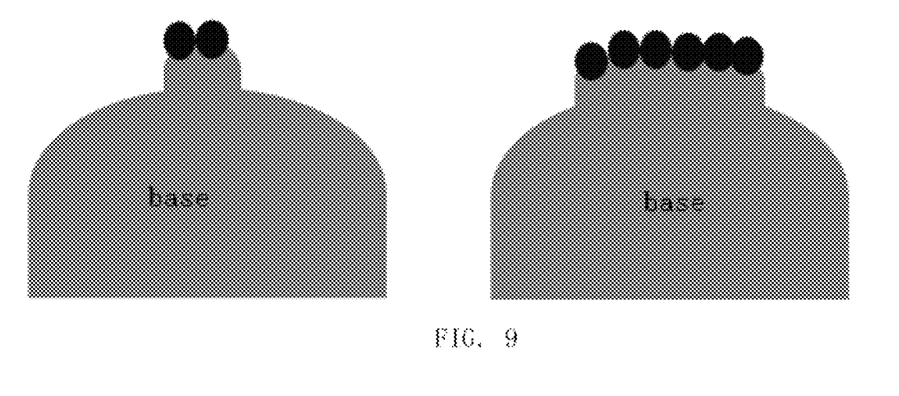
FIG. 9 schematically illustrates a schematic diagram of adjusting the number of emission sites according to an embodiment of the present disclosure.

FIG. 9 schematically illustrates a schematic diagram of adjusting the number of emission sites in accordance with an embodiment of the present disclosure.

As shown in FIG. 9, the number of emission sites can be adjusted by adjusting the size of the protrusions, since the protrusions are nano-scale, and the emission sites can also be nano-scale, and the number of emission sites that can be accommodated by each protrusion is limited, and therefore, the number of emission sites that can be formed on the small protrusions would be small (left Figure of FIG. 9). If the size of the tip protrusion is increased, more emission sites can be formed by adjusting the voltage, thereby increasing the emission current (right Figure of FIG. 9).

Figure 10:
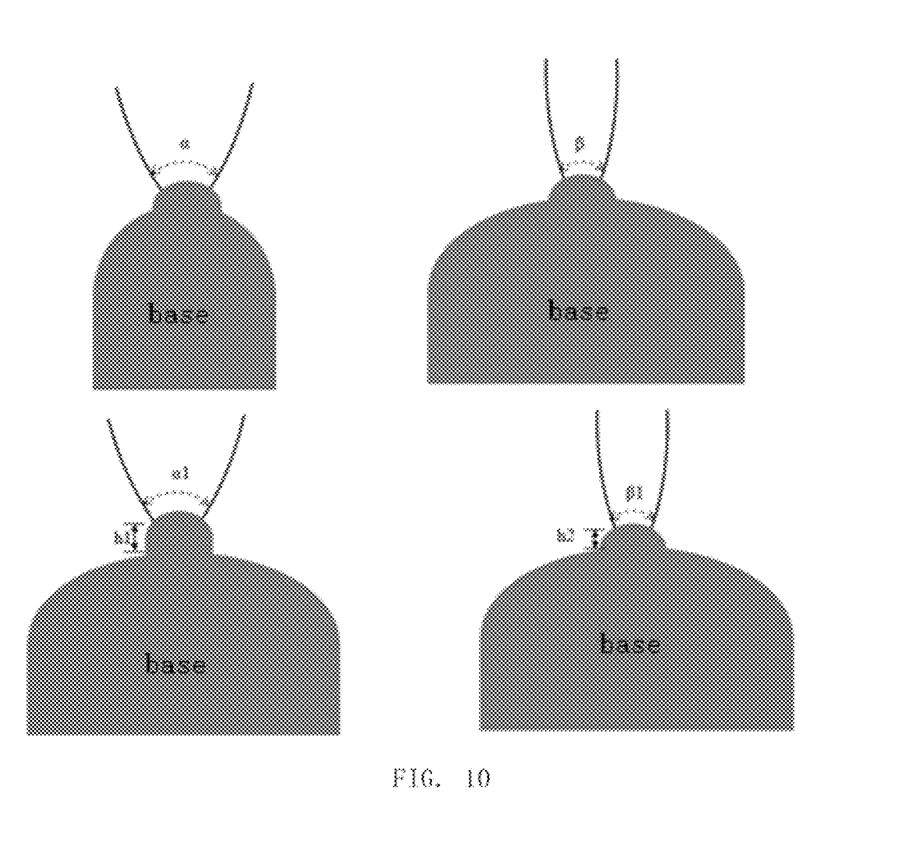
FIG. 10 schematically illustrates a schematic diagram of adjusting a beam angle according to an embodiment of the present disclosure.

FIG. 10 schematically illustrates a schematic diagram of adjusting a beam angle in accordance with an embodiment of the present disclosure.

As shown in FIG. 10, where $\alpha$ and $\beta$ respectively represent beam angles, and h1 and h2 respectively indicate the height of the protrusions. The magnitude of the beam angle can be adjusted by adjusting the size of the base and/or the size of the protrusions. For example, if the protrusions have the same size, the smaller the size of the base is, the greater the beam angle $\alpha$ is; and conversely, if the protrusions have the same size, the greater the size of the base is, the smaller the beam angle $\beta$ is (upper Figure of FIG. 10). Further, if the sizes of bases are the same, the higher the height h1 of the protrusion is, the greater the beam angle $\alpha 1$ is, and conversely, the lower the height h2 of the protrusion is, the smaller the beam angle $\beta 1$ is (lower Figure of FIG. 10).

In summary, the beam angle can be reduced by increasing the size of the base and/or reducing the height of the protrusion formed through field evaporation.

Further, it is also possible to adjust the shape of the protrusion to change the direction of the emission current, such that for example, the direction of the emission current of the protrusion which does not coincide with the axis of tip is different from the direction of the emission current of the protrusion which coincides with the axis of tip. In addition, by controlling the structure of the tip protrusion and the base (for example, by field evaporation or field etching), the voltage of the emission current can be made be consistent (for example, for a protrusion formed by field etching, if the etching voltage is V1±0.5 KV, then the voltage of emitting stable emission current is V2±0.1 KV).

Figure 11:
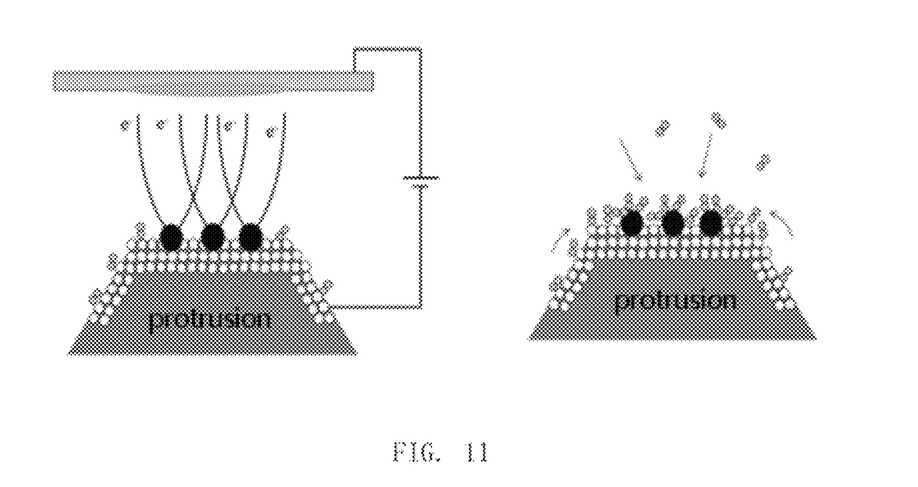
FIG. 11 schematically shows a schematic diagram of a process of using an electron source in accordance with an embodiment of the present disclosure.

FIG. 11 schematically shows a schematic diagram of process of using an electron source in accordance with an embodiment of the present disclosure.

As shown in FIG. 11, in a case where the electron source is applied with a negative bias voltage to emit a current, the gas molecules on the surface of the tip and in the environment will be gradually adsorbed on the surface of the tip, so that the emission ability of the electron source is lowered or even disappear. In the disclosure, the above principle is used to remove the unwanted emission sit. Since the emission site is fixed on the surface of the tip, and the emission site disappears at a temperature higher than the desorption temperature of the gas molecules, and the free substances or gas molecules can be detached from the surface of the needle tip by heating, thereby restoring the emission capability of the electron source.

According to another aspect of the present disclosure, there is provided an electron gun, comprising: the electron source manufactured by the method described above, a cooling device, a heating device and a gas introduction device. The electron source is configured for emitting electrons, the cooling device is configured for dissipating heat for the electron source, the electron source is fixed to the cooling device by an electrically insulating heat conductor, the heating device is configured for heating the electron source so as to adjust a temperature of the electron source, and the gas introduction device is configured for introducing a hydrogen-containing gas. Since the formation temperature and the operation temperature of the emission site on the electron source surface of the electron gun are lower, the structure of the electron source will not be changed during operation, the value of the applied voltage will not be changed, and the value of the voltage is more stable, so that the design of the electron gun is simpler.

It will be appreciated by those skilled in the art that the various embodiments of the present disclosure and/or the various features recited in the claims may be combined or integrated, even if such combinations or integrations are not explicitly described in the present disclosure. In particular, the various embodiments of the present disclosure and/or the various features recited in the claims may be combined or integrated without departing from the spirit and scope of the present disclosure. All such combinations and/or integrations fall within the scope of the present disclosure.

The embodiments of the present disclosure have been described above. However, the embodiments are merely for illustrative purposes and are not intended to limit the scope of the present disclosure. Although the various embodiments have been described above, this does not mean that the measures in the various embodiments cannot be advantageously used in combination. The scope of the present disclosure is defined by the appended claims and their equivalents. Numerous alternatives and modifications may be made by those skilled in the art without departing from the scope of the present disclosure, and such alternatives and modifications should fall within the scope of the present disclosure.

What is claimed is:

1. A method of manufacturing a field emission electron source, the method comprising:
    forming one or more fixed emission sites on at least one needle tip, the one or more fixed emission sites including a reaction product formed by metal atoms on a surface of the at least one needle tip and gas molecules, and the one or more fixed emission sites are rooted in the surface of the at least one needle tip, wherein the reaction is carried out without an ion bombardment,
    wherein the gas molecules include hydrogen-containing gas molecules and one or more of the following: nitrogen-containing gas molecules, carbon-containing gas molecules or oxygen-containing gas molecules,
    wherein an electric field is obtained by applying a bias voltage, and
    wherein the applying a bias voltage comprises one or more of the following: applying a positive bias voltage, applying a negative bias voltage, or a combination of applying a positive bias voltage and applying a negative bias voltage,
    wherein in a case where a negative bias voltage is applied for forming the fixed emission site, the negative bias voltage is applied to the needle tip to generate an emission current having a current value in an order of microamperes,
    wherein the negative bias voltage is maintained for a preset duration or is adjusted until an emission current of a predetermined value is generated, and
    wherein the negative bias voltage is adjusted such that the field emission electron source emits a current of an order of less than 1 mA, so as to avoid the needle tip from being changed in terms of a morphology or burnt-out,
    and/or
    wherein in a case where a positive bias voltage is applied to the needle tip for forming the fixed emission sites, the positive bias voltage is applied to the needle tip for a preset duration,
    wherein the positive bias voltage has a value less than a value of a bias voltage for field evaporation for forming a protrusion.

2. The method as claimed in claim 1, wherein the one or more fixed emission sites are formed by reaction of the metal atoms with the gas molecules under an electric field.

3. The method as claimed in claim 1,
    wherein the at least one needle tip comprises a base and one or more high-field-strength structures on the base where a field strength is higher than other portions of the base, wherein an outer surface of at least one of the high-field-strength structures comprises the metal atoms, and/or
    wherein the at least one needle tip comprises a base and one or more active regions on the base that are more reactive than other portions of the base, wherein an outer surface of at least one of the active regions comprises the metal atom, and/or
    wherein the at least one needle tip comprises a base and one or more high-field-strength structures on the base where a field strength is higher than other portions of the base, at least a portion of a surface of the high-field-strength structures being an active region having a greater reaction activity.

4. The method as claimed in claim 3, wherein the high-field-strength structures comprise protrusions.

5. The method as claimed in claim 4, wherein the protrusions have sizes in a range from a sub-nanometer order to 100 nanometers order.

6. The method as claimed in claim 4, wherein the protrusions are formed by one or more of the following processes: heat treatment, application of an electric field, thermal-electric field treatment, etching, or nanofabrication.

7. The method as claimed in claim 4,
wherein for a needle tip including a protrusion, the metal atoms of at least a portion of the surface of the protrusion has the same or greater reaction activity than a surface of other portions of the base in reaction with the gas molecules under a vacuum condition, and
wherein for a needle tip including no protrusion, the metal atoms on the surface of the active region of the base are more reactive than the surface of other portions of the base in a reaction with the gas molecules under a vacuum condition.

8. The method as claimed in claim 3, further comprising:
adjusting a beam angle of an electron beam by adjusting size and shape of the base and/or high-field-strength structure of the needle tip; and/or
adjusting a number of the fixed emission sites by adjusting a size of the high-field-strength structure and/or the active region; and/or
adjusting a magnitude or consistency of a voltage at which the electron source emits current by adjusting a structure of the base and/or a structure of the high-field-strength structure; and/or
adjusting a direction of an emission current by adjusting a shape of a top of the needle tip.

9. The method as claimed in claim 1,
wherein the hydrogen-containing gas molecules comprise introduced hydrogen-containing gas molecules and/or comprise gas molecules remaining in a vacuum environment, and
wherein a rate of formation of the fixed emission sites is adjusted by adjusting a rate of introduction of the hydrogen-containing gas molecules.

10. The method as claimed in claim 1,
wherein the hydrogen-containing gas molecules comprise hydrogen molecules,
wherein the metal atoms comprise tungsten atoms, and
wherein the fixed emission sites comprise a hydrogen tungsten compound.

11. The method as claimed in claim 1,
wherein for the positive bias voltage applied, a resulting field strength comprises a range from 1 V/nm to 50 V/nm, or
wherein for the negative bias voltage applied, the resulting field strength comprises a range from 1 V/nm to 30 V/nm.

12. The method as claimed in claim 1, wherein a number of the fixed emission sites formed is adjusted by adjusting a value of the applied bias voltage or adjusting a value of a preset duration.

13. The method as claimed in claim 2,
wherein in a case where a temperature of the needle tip is lower than or equal to 1,000K, a pressure is less than or equal to $10^{-3}$ Pa, or
wherein in a case where the temperature of the needle tip is higher than or equal to 500K and lower than or equal to 800K, the pressure is less than or equal to $10^{-6}$ Pa, or
wherein in a case where the temperature of the needle tip is lower than or equal to 150K, the pressure is less than or equal to $10^{-6}$ Pa.

14. The method as claimed in claim 2, further comprising:
adjusting uniformity of the fixed emission sites by adjusting a number of fixed emission sites; and/or
adjusting a magnitude of a current by adjusting the number of fixed emission sites; and/or
increasing a stability of the emission current by increasing the number of fixed emission sites.

15. The method as claimed in claim 1, further comprising:
after forming the one or more fixed emission sites on the at least one needle tip, applying an electric field so that the gas molecules are adsorbed on the fixed emission sites to remove at least one emission site.

16. A method of manufacturing a field emission electron source, the method comprising:
forming one or more fixed emission sites on at least one needle tip, the one or more fixed emission sites including a reaction product formed by metal atoms on a surface of the at least one needle tip and gas molecules,
wherein the one or more fixed emission sites are formed by reaction of the metal atoms with the gas molecules under an electric field,
wherein the gas molecules include hydrogen-containing gas molecules and one or more of the following: nitrogen-containing gas molecules, carbon-containing gas molecules or oxygen-containing gas molecules,
wherein the hydrogen-containing gas molecules comprise hydrogen molecules,
wherein the metal atoms comprise tungsten atoms, and
wherein the fixed emission sites comprise a hydrogen tungsten compound.

17. A method of manufacturing a field emission electron source, the method comprising:
forming one or more fixed emission sites on at least one needle tip, the one or more fixed emission sites including a reaction product formed by metal atoms on a surface of the at least one needle tip and gas molecules,
after forming the one or more fixed emission sites on the at least one needle tip, applying an electric field so that the gas molecules are adsorbed on the fixed emission sites to remove at least one emission site,
wherein the gas molecules include hydrogen-containing gas molecules.

* * * * *